United States Patent
Furukawa et al.

(10) Patent No.: US 10,763,346 B2
(45) Date of Patent: Sep. 1, 2020

(54) SEMICONDUCTOR DEVICE AND POWER CONVERSION APPARATUS

(71) Applicant: Hitachi Power Semiconductor Device, Ltd., Hitachi-shi, Ibaraki (JP)

(72) Inventors: Tomoyasu Furukawa, Tokyo (JP); Masaki Shiraishi, Tokyo (JP); Toshiaki Morita, Tokyo (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 0 days.

(21) Appl. No.: 16/465,429

(22) PCT Filed: Dec. 25, 2017

(86) PCT No.: PCT/JP2017/046299
§ 371 (c)(1),
(2) Date: May 30, 2019

(87) PCT Pub. No.: WO2018/135239
PCT Pub. Date: Jul. 26, 2018

(65) Prior Publication Data
US 2020/0006301 A1 Jan. 2, 2020

(30) Foreign Application Priority Data

Jan. 19, 2017 (JP) .................................. 2017-007161

(51) Int. Cl.
*H01L 29/739* (2006.01)
*H01L 23/522* (2006.01)
(Continued)

(52) U.S. Cl.
CPC ........ *H01L 29/7397* (2013.01); *H01L 23/522* (2013.01); *H01L 29/41708* (2013.01); *H01L 29/45* (2013.01); *H01L 29/861* (2013.01)

(58) Field of Classification Search
CPC ... H01L 25/115; H01L 21/768; H01L 23/522; H01L 29/7397; H01L 29/41708; H01L 29/7395
See application file for complete search history.

(56) References Cited

U.S. PATENT DOCUMENTS

| 2008/0237851 A1 | 10/2008 | Morita et al. |
| 2010/0270515 A1 | 10/2010 | Yasuda et al. |

(Continued)

FOREIGN PATENT DOCUMENTS

| CN | 104821282 A | 8/2015 |
| JP | 10-093086 | 4/1998 |

(Continued)

OTHER PUBLICATIONS

International Search Report (PCT/ISA/210) issued in PCT Application No. PCT/JP2017/046299 dated Mar. 20, 2018 with English translation (four (4) pages).

(Continued)

*Primary Examiner* — Changhyun Yi
(74) *Attorney, Agent, or Firm* — Crowell & Moring LLP

(57) ABSTRACT

Provided is a semiconductor device in which, in a case where a metallic plate (a conductive member) is bonded by being sintered to a semiconductor chip having an IGBT gate structure, an excess stress is less likely to be generated in a gate wiring section of the semiconductor chip even when pressure is applied in a sinter bonding process, so that a characteristic failure is reduced. The semiconductor device according to the present invention is characterized by: being provided with a semiconductor chip having a gate structure represented by an IGBT; including first gate wiring and second gate wiring formed on the surface of the semiconductor chip; and including an emitter electrode disposed so as to cover the first gate wiring and a sintered layer disposed above the emitter electrode, wherein a multilayer structure (Continued)

formed by including at least the emitter electrode and the sintered layer on the surface of the semiconductor chip continuously exists over a range including an emitter electrode connecting contact and gate wiring regions.

20 Claims, 16 Drawing Sheets

(51) Int. Cl.
*H01L 29/417* (2006.01)
*H01L 29/45* (2006.01)
*H01L 29/861* (2006.01)

(56) References Cited

U.S. PATENT DOCUMENTS

| | | |
|---|---|---|
| 2011/0042742 A1 | 2/2011 | Bhalla et al. |
| 2011/0049562 A1* | 3/2011 | Suzuki ............. H01L 29/41725 257/139 |
| 2012/0176828 A1 | 7/2012 | Shiraishi et al. |
| 2013/0119322 A1 | 5/2013 | Ide et al. |
| 2015/0221626 A1* | 8/2015 | Motowaki ............... H01L 24/49 257/712 |
| 2016/0172301 A1* | 6/2016 | Iwasaki ............. H01L 21/76843 257/751 |
| 2016/0293562 A1 | 10/2016 | Nishimoto et al. |
| 2016/0336393 A1 | 11/2016 | Kim et al. |
| 2017/0200692 A1* | 7/2017 | Gowda .................. H01L 24/06 |

FOREIGN PATENT DOCUMENTS

| | | |
|---|---|---|
| JP | 10-303228 | 11/1998 |
| JP | 2008-244242 | 10/2008 |
| JP | 2011-49393 | 3/2011 |
| JP | 2012-28674 | 2/2012 |
| JP | 2012-146810 | 8/2012 |
| JP | 2012-191238 | 10/2012 |
| JP | 2015-230932 | 12/2015 |
| JP | 2016-12582 | 1/2016 |
| TW | 201110146 A1 | 3/2011 |
| TW | 201539680 A | 10/2015 |
| TW | 201626468 A | 7/2016 |

OTHER PUBLICATIONS

Japanese-language Written Opinion (PCT/ISA/237) issued in PCT Application No. PCT/JP2017/04629 dated Mar. 20, 2018 (six (6) pages).
Taiwanese Office Action issued in counterpart Taiwanese Application No. 107101766 dated May 21, 2018 with partial English translation (three (3) pages).
Extended European Search Report issued in European Application No. 17892804.0 dated Jun. 4, 2020 (nine (9) pages).

\* cited by examiner

SEMICONDUCTOR DEVICE AND POWER CONVERSION APPARATUS

TECHNICAL FIELD

The present invention relates to a semiconductor device characterized by a junction layer of an electrical junction (for example, a junction between a semiconductor element and a circuit member) in an electronic component, and particularly to a semiconductor device having a sintered junction layer and a power conversion apparatus using the same.

BACKGROUND ART

Semiconductor devices have been used in a wide range of fields such as system large scale integration (LSI), power conversion apparatuses, and control devices for hybrid vehicles. As such semiconductor devices, for example, one using "solder" or a "solder alloy" containing lead for electrical junction between an electrode terminal of an electronic component and an electrode terminal of a circuit pattern on a circuit board has been once the mainstream.

Meanwhile, the use of lead is severely restricted from the viewpoint of protecting the global environment, and development to use lead within such a restricted scope or to join an electrode or the like of a semiconductor device with a lead-free material has been advanced. In particular, an effective material as an alternative to "high-temperature solder" has not yet been found. Since it is indispensable to use "hierarchical solder" in mounting of a semiconductor device, there is a demand for the appearance of materials substituting for the "high-temperature solder".

Based on such a background, conventionally, a joining technique of joining electrodes using a composite material of metal particles and an organic compound as a joining material is proposed as a substitute for the "high-temperature solder".

For example, PTL 1 describes a method of performing junction under reducing atmosphere using a joining material containing a reducing agent consisting of cupric oxide (CuO) particles and an organic substance as a joining technique that can provide excellent joining strength with respect to electrodes of nickel (hereinafter referred to as "Ni") or copper (hereinafter referred to as "Cu"). In this method, copper particles of 100 nm or smaller are generated during heating and reduction, and the copper particles are sintered and joined. The same PTL further describes that a material containing sintered silver fine particles is used as a joining material that joins a semiconductor chip and a metal plate.

Further, PTL 2 describes a solving method from the viewpoint of stress buffering for eliminating a connecting portion having a large difference in thermal expansion coefficient using a metal plate having an intermediate thermal expansion coefficient between a wiring member and a semiconductor chip, as a technique of improving the reliability of wiring connection.

CITATION LIST

Patent Literature

PTL 1: JP 2008-244242 A
PTL 2: JP 2012-28674 A

SUMMARY OF INVENTION

Technical Problem

The joining technique using the cupric oxide (CuO) particles described in PTL 1 can improve a joining property with respect to Ni and Cu as compared with the conventional nanoparticle joining, and can be expected as a joining material for the Ni electrode or Cu electrode. For example, it is possible to electrically connect a connection terminal to a Ni electrode of a power semiconductor chip such as an insulated gate bipolar transistor (IGBT) and a freewheel diode used in an inverter of a power conversion apparatus via a junction layer consisting of a copper sintered layer.

A main electrode of a semiconductor chip made of silicon (hereinafter referred to as "Si") or silicon carbide (hereinafter referred to as "SiC") is connected to another chip or electrode via a wiring material such as a wire and a ribbon made of copper, aluminum, or the like. When an operating temperature of the semiconductor chip increases, there is a problem that trouble occurs at a junction due to thermal fatigue while repeating a switching operation (switching operation between ON and OFF of energization) because there is a difference in thermal expansion coefficient between the semiconductor chip and the wiring material.

Therefore, as a technique of improving the reliability of wiring connection, a solving method from the viewpoint of stress buffering for eliminating a connection portion having a large thermal expansion coefficient difference by using a metal plate having an intermediate thermal expansion coefficient between a wiring member and a semiconductor chip is proposed as described in PTL 2.

However, when sintering and joining the metal plate (conductive member) onto the semiconductor chip having a gate structure such as an IGBT, there is a problem that an excessive stress is generated in the gate wiring portion of the conductor chip by pressurization in the sintering and joining process so that a crack is generated. There is a problem that the generated crack sometimes causes, for example, a short-circuit defect between a gate and an emitter which is a main electrode, a main breakdown voltage reduction defect between the emitter and a collector, and the like.

In view of such circumstances, an object is to provide a semiconductor device capable of reducing characteristic defects caused by pressurization in a sintering and joining process, a manufacturing method of the semiconductor device, and a power conversion apparatus using the semiconductor device.

Solution to Problem

In order to solve the above-described problems, a semiconductor device of the present invention includes: a semiconductor chip; a first gate wiring and a second gate wiring formed on a front surface of the semiconductor chip; an emitter electrode arranged so as to cover the first gate wiring; and a sintered layer arranged above the emitter electrode, and is characterized in that a multilayer structure formed of at least the emitter electrode and the sintered layer is continuously present over a range including an emitter electrode connecting contact and a gate wiring region on the front surface of the semiconductor chip.

Further, a power conversion apparatus of the present invention is a power conversion apparatus which receives DC power from an outside as an input, converts the input DC power into AC power, and outputs the AC power, and is characterized by including: a pair of DC terminals configured to receive the DC power as the input; and AC terminals configured to output the AC power, the AC terminals as many as a number of AC phases related to the AC power. For each of the AC terminals provided as many as the number of phases, the power conversion apparatus is further configured such that a series circuit having a configuration in which two parallel circuits each of which is obtained by connecting a switching element and a diode having a polarity opposite to a polarity of the switching element to each other in parallel are connected in series is connected between one of the pair of DC terminals and the other, and an interconnection point of the two parallel circuits forming the series circuit is connected to the AC terminal of a phase corresponding to the series circuit. The parallel circuit is configured using the semiconductor device of the present invention.

Advantageous Effects of Invention

According to the present invention, it is possible to suppress excessive stress from being applied to a gate wiring portion due to pressurization when a metal plate (conductive member) is sintered and joined onto the semiconductor chip having a gate structure such as an IGBT and to protect the gate electrode by the emitter electrode. Thus, it is possible to provide the semiconductor device in which a crack is hardly generated even if pressurization is performed in the sintering and joining process and the characteristic defects are reduced.

BRIEF DESCRIPTION OF DRAWINGS

FIG. 6 is a bird's-eye view of a region B of

FIG. 5 of the semiconductor device according to the first embodiment of the present invention.

DESCRIPTION OF EMBODIMENTS

Figure 1:
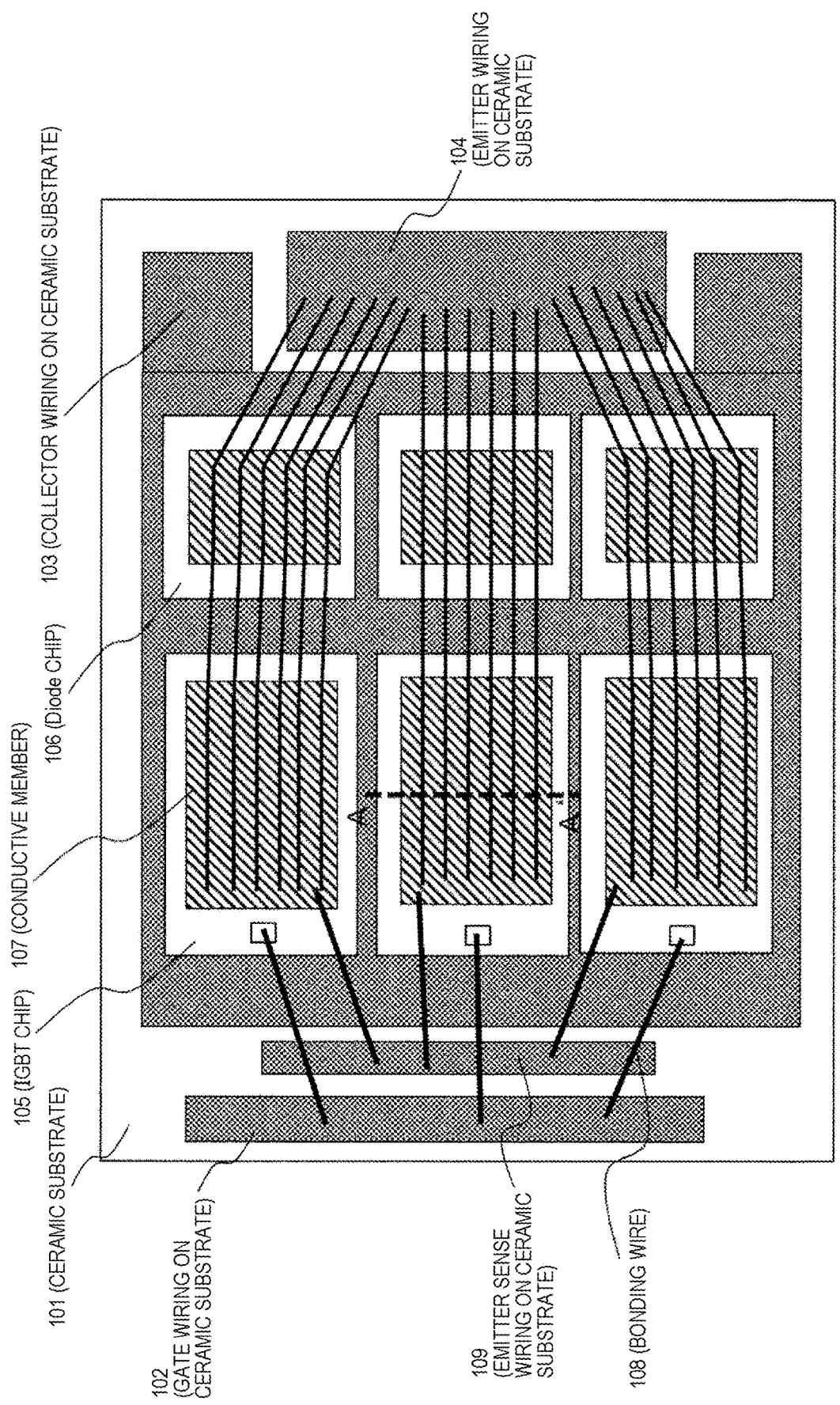
FIG. 1 is a top view of a semiconductor device according to a first embodiment of the present invention.

A semiconductor device of the present invention includes: a semiconductor chip (105) having a gate structure typified by an IGBT; a first gate wiring (206) and a second gate wiring (202) formed on a front surface of the semiconductor chip; an emitter electrode (205) arranged so as to cover the first gate wiring; and a sintered layer arranged above the emitter electrode, and is characterized in that a multilayer structure (a layer structure having two or more layers) formed of at least the emitter electrode and the sintered layer is continuously present over a range including an emitter electrode connecting contact (506) and gate wiring regions (503 and 504) on the front surface of the semiconductor chip.

In the above configuration of the present invention, it may be configured such that a difference in level between the gate wiring (504) in an active portion and the emitter electrode (205) is reduced. As a result, it is possible to reduce a bias of pressure when a conductive member (107) and the IGBT chip are connected to each other via the sintered layer.

Further, it may be configured such that the gate wiring is mechanically protected by the emitter electrode and Ni plating in the above configuration of the present invention. As a result, it is possible to reduce generation of cracks.

Hereinafter, embodiments of the present invention will be described with reference to the drawings.

In each drawing, those having the same reference numeral indicate the same constituent elements or constituent elements having similar functions. Further, p−, p, and p+ indicate that a conductivity type of a semiconductor layer is a p type, and the relative impurity concentration increases in this order. Further, n−, n, and n+ indicate that a conductivity type of a semiconductor layer is an n type, and the relative impurity concentration increases in this order.

Example 1

Figure 2:
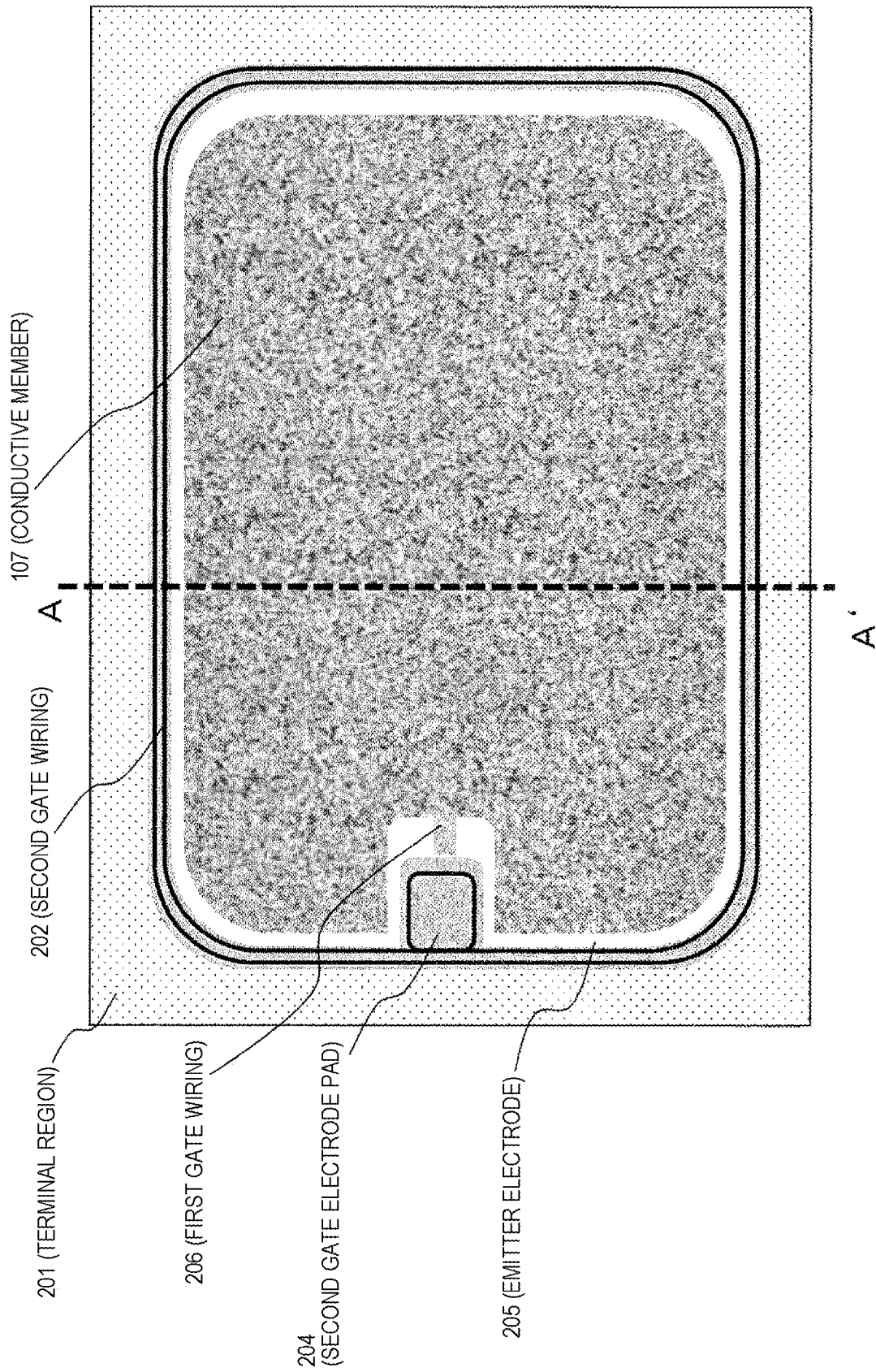
FIG. 2 is a top view illustrating a mounting mode of a portion of an IGBT chip in the semiconductor device according to the first embodiment of the present invention.
Figure 3:
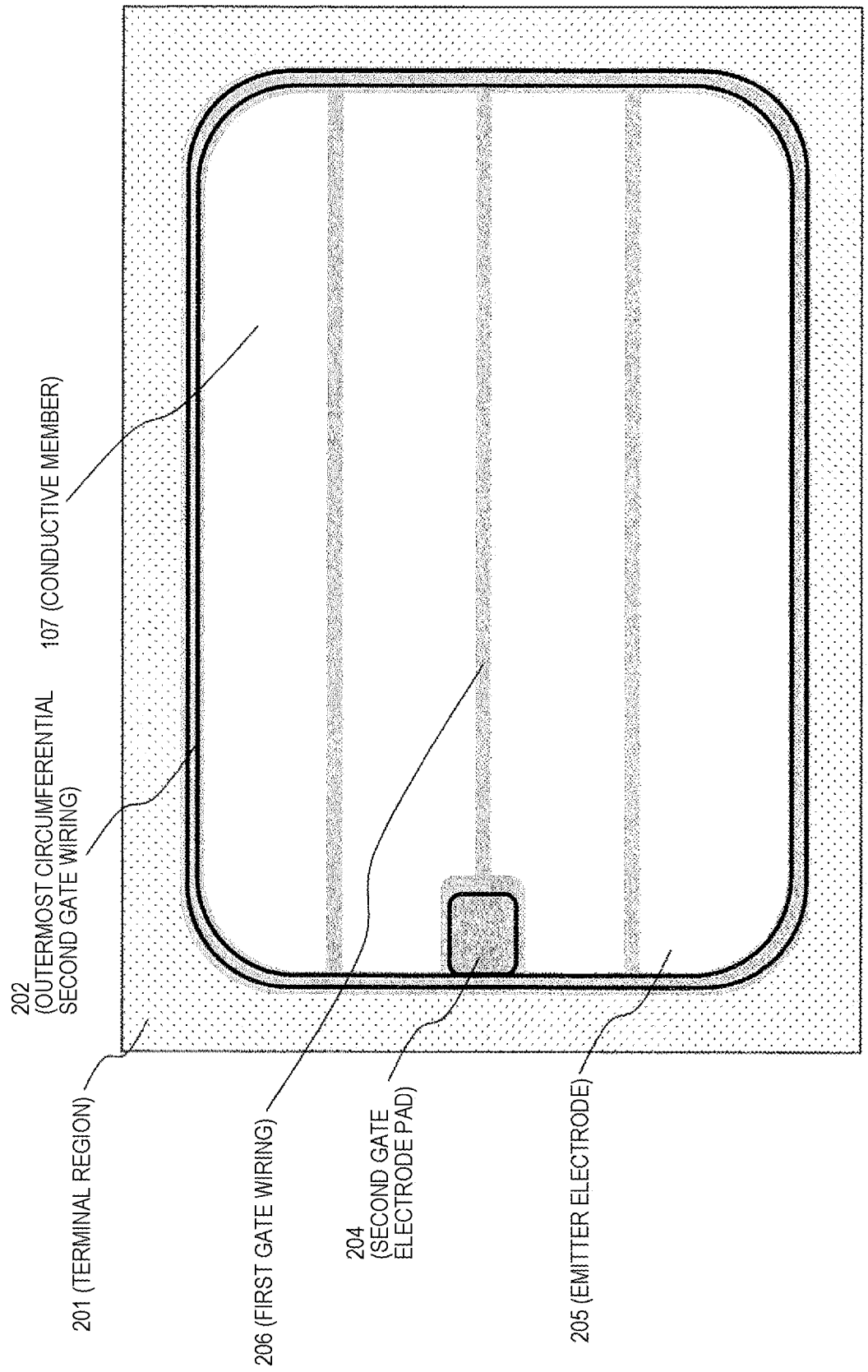
FIG. 3 is a top view of the portion of the IGBT chip in the semiconductor device according to the first embodiment of the present invention.
Figure 4:
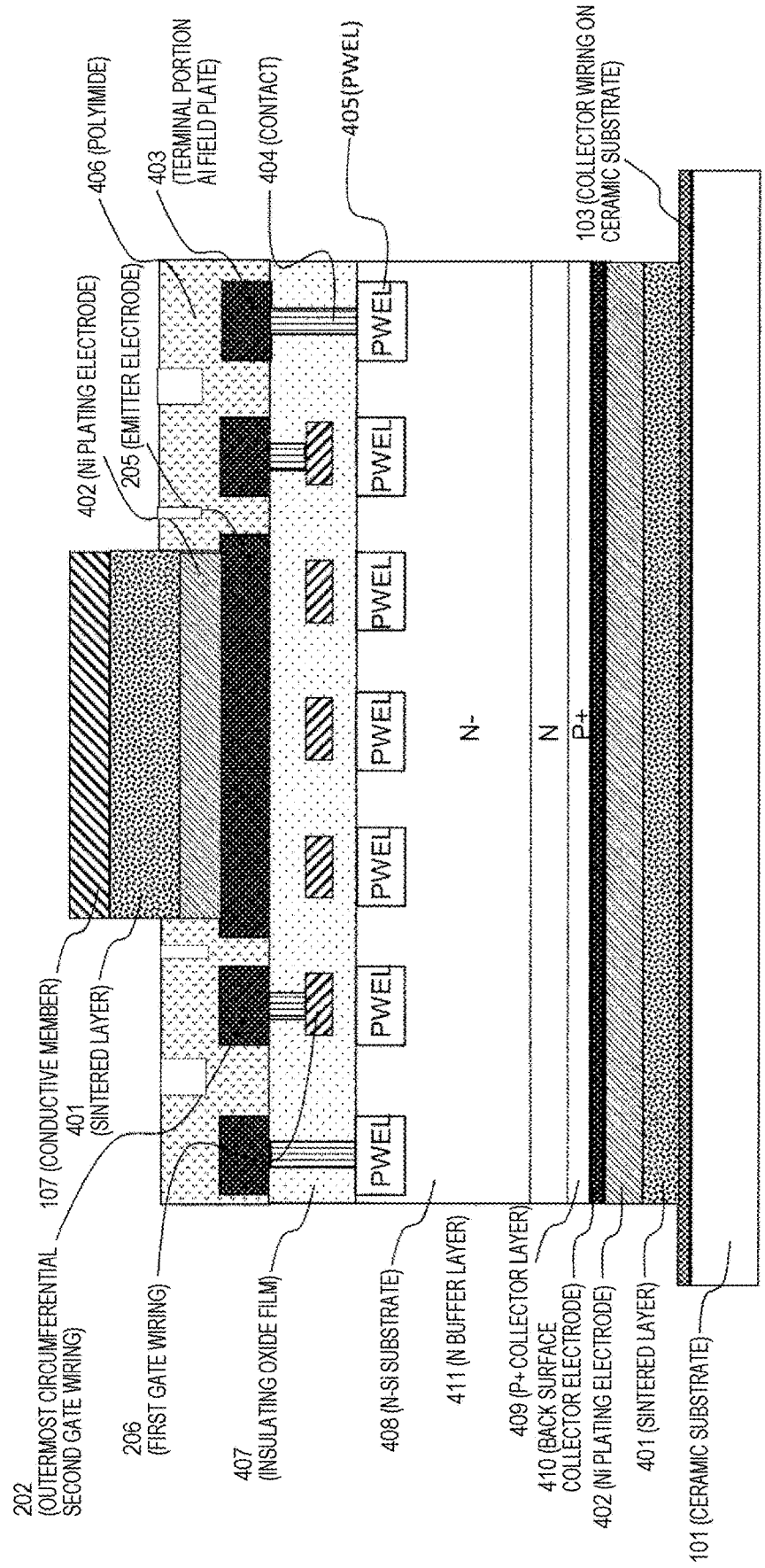
FIG. 4 is a cross-sectional view of the semiconductor device according to the first embodiment of the present invention taken along a line A-A' of FIG. 1.

FIG. 1 is a top view of a semiconductor device according to Example 1 which is a first embodiment of the present invention. Further, FIG. 2 is a top view illustrating a mounting mode of a portion of the IGBT chip in the semiconductor device of FIG. 1. Further, FIG. 3 is a top view of the portion of the IGBT chip in the semiconductor device of FIG. 1. Further, FIG. 4 is a cross-sectional view illustrating a configuration of a cross section of the semiconductor device taken along a line A-A' of FIG. 1.

The semiconductor device of this example is an example of the case of being applied to an IGBT module. Incidentally, the configuration of using a module in which an IGBT chip and a freewheel diode chip are mounted on a common collector wiring on a ceramic substrate as the semiconductor device will be described in this example, but the present invention is not limited to this configuration. It is possible to similarly apply a technical idea of the present invention even to, for example, a configuration in which a metal-oxide-semiconductor field-effect transistor (MOSFET) chip is mounted together with a freewheel diode chip or a so-called diode-less configuration in which the MOSFET chip is mounted and a body diode of the MOSFET chip is used as a reflux diode without mounting the freewheel diode chip, and thus, these configurations are also included in a technical scope of the present invention.

On a ceramic substrate 101, a collector wiring 103 on the ceramic substrate, an IGBT chip 105, and a diode chip 106 are joined to each other via a lower sintered junction layer (sintered layer) 401 which will be described later in the description of FIG. 4. Separate conductive members 107 are connected above the IGBT chip 105 and the diode chip 106 by an upper sintered junction layer (sintered layer) 401, and an emitter of the IGBT chip 105 and an anode of the diode chip are connected to each other by a bonding wire and are connected to an emitter wiring 104 on the ceramic substrate and an emitter sense wiring 109 on the ceramic substrate by separate bonding wires, respectively. As described above, the sintered layers 401 are configured to include the lower layer and the upper layer, and both the layers are separated from each other.

Further, a gate electrode pad 204 of the IGBT chip is connected to a gate wiring on the ceramic substrate by a bonding wire.

FIG. 2 is the top view illustrating the mounting mode of the portion of the IGBT chip in the semiconductor device of the present invention. The IGBT chip 105 includes a terminal region 201 in which an Al field plate 403 configured to hold a breakdown voltage of the IGBT and a PWEL 405 are arranged in a ring shape on the chip outer circumference and an element active region on the inner side of the terminal region 201, and an emitter electrode 205 and the gate electrode pad 204 are formed thereon. On the emitter electrode, the conductive member 107 is connected by the sintered junction layer 301, and a second gate wiring 202 is arranged on an outer circumferential portion of the conductive member 107.

FIG. 3 is the top view of the IGBT chip before connecting the conductive member. A first gate wiring is formed below the emitter electrode, is connected to the second gate wiring 202 at the outer circumferential portion, and distributes a signal input from the gate electrode pad into the IGBT chip.

FIG. 4 is the cross-sectional view of the semiconductor device in the case where the semiconductor device of the present invention is cut along the line A-A' of FIGS. 1 and 2, and this drawing also illustrates a cross section of a gate wiring portion. In the IGBT chip, an N buffer layer 408 and a P+ collector layer 409 are formed on a back surface of an n– Si substrate 408, and a Ni plating electrode 402 is formed on a back surface electrode 410 (for example, a stacked structure of AlSi/Ti/AlSi). The IGBT chip is connected to the collector wiring 101 on the ceramic substrate by the sintered layer (for example, sintered Cu). The gate wiring formed on a front surface of the IGBT chip is electrically insulated by an insulating oxide film 407, and the PWEL 405 is arranged below the gate wiring in order to hold the breakdown voltage. The gate wirings include the first gate wiring 206 and the second gate wiring 202. For example, the first gate wiring 206 is formed using polysilicon, the second gate wiring is formed using Al, and the first gate wiring 206 and the second gate wiring 202 are connected by a contact (for example, Ti/TiN/W) at the outer circumferential portion of an active region. In an outermost circumferential region of the IGBT chip, the Al field plate 403 and the PWEL 405 are arranged to serve a role of holding the breakdown voltage. In the active region, the emitter electrode 205 (for example, a stacked structure of AlSi/Ti/AlSi) is arranged, the Ni plating electrode 402 is formed similarly to the back surface electrode and is connected to the conductive member 107 by the sintered layer (for example, sintered Cu). The emitter electrode, the second gate wiring 202, and the Al field plate 403 are insulated by polyimide 406. Here, the conductive member 107 is required to have a role of mitigating thermal stress caused by a difference in thermal expansion coefficient between a semiconductor chip and a wiring member and a role of dissipating heat from the semiconductor chip. Therefore, as the conductive plate, it is preferable to use a material having an intermediate thermal expansion coefficient between the semiconductor chip and the wiring member and having a thermal conductivity of 100 W/mK or more. Further, if a material having a higher thermal conductivity in a horizontal direction to an electrode surface of the semiconductor chip than that in a vertical direction is used as the conductive member 107, heat is diffused within a plane along a chip surface of the conductive plate before heat generated from the chip is transferred to the wiring of the wire or ribbon on the upper side, and a favorable heat equalizing effect can be obtained. Thus, only a specific portion of the chip is heated to a high temperature so that the wire or ribbon is not peeled off, and the wiring connection reliability is improved as the whole chip. For example, it is possible to use a material in which graphite fibers having thermal conductivity anisotropy such as 20 W/mK in one plane and 2000 W/mK in a direction orthogonal to the plane are combined with metal (copper, aluminum, or the like). Further, it is also preferable to use a material obtained by stacking layers having different thermal conductivities such as a clad material of copper/invar/copper. One reason thereof is because a thermal conductivity of invar (iron-nickel alloy) is 13 W/mK, which is smaller than copper of 400 W/mK so that it is difficult to transmit the heat generated from the semiconductor chip to the upper portion, and the heat propagates to be equalized through the inside of copper along the chip surface. Another reason thereof is because it is possible to adjust a thermal expansion coefficient to a preferable value intermediate between Si and SiC (3 to 5 ppm/K) and the wiring member (Al of about 23 ppm/K, Cu of about 16 ppm/K) depending on a ratio of copper (thermal expansion coefficient: about 16 ppm/K) and invar (about 1 ppm/K), and the thermal stress can be reduced.

The connection between the conductive member 107 and the IGBT chip by the sintered layer is obtained by a method of coating only a necessary portion using a metal mask having an opening in a sintered-material-coated portion, a method of coating a necessary portion using a dispenser, a method of applying a water-repellent resin containing silicone, fluorine, or the like using a metal mask or a mesh-like mask having an opening only in a necessary portion or applying a photosensitive water-repellent resin on a substrate or an electronic component, removing a portion to be coated with a joining material by exposure and development, and applying a joining paste to the opening, or a method of removing a portion to be coated with a joining material by a laser after applying a water-repellent resin to a substrate or an electronic component, and then, applying a joining paste to an opening thereof. These coating methods can be combined in accordance with the area and a shape of an electrode to be joined. In the present example, the sintered layer is printed and applied below the conductive member 107 to perform joining.

In the joining using the present joining material, it is preferable to apply heat and a pressure of 0.01 to 5 MPa in order to generate metal particles having a particle size of 100 nm or smaller from a metal particle precursor at the time of joining and to perform metal bonding by fusing of the metal particles having the particle diameter of 100 nm or smaller while discharging an organic substance in a junction layer. The emitter electrode 205 and the Ni plating 402, which are arranged on the first gate wiring 206, serve a role of reducing the generation of cracks in the first gate wiring 206 and the Si substrate due to excessive stress caused by the pressure when being connected with the conductive member 107.

Next, a relationship between a gate wiring region and an emitter electrode region will be described in detail.

Figure 5:
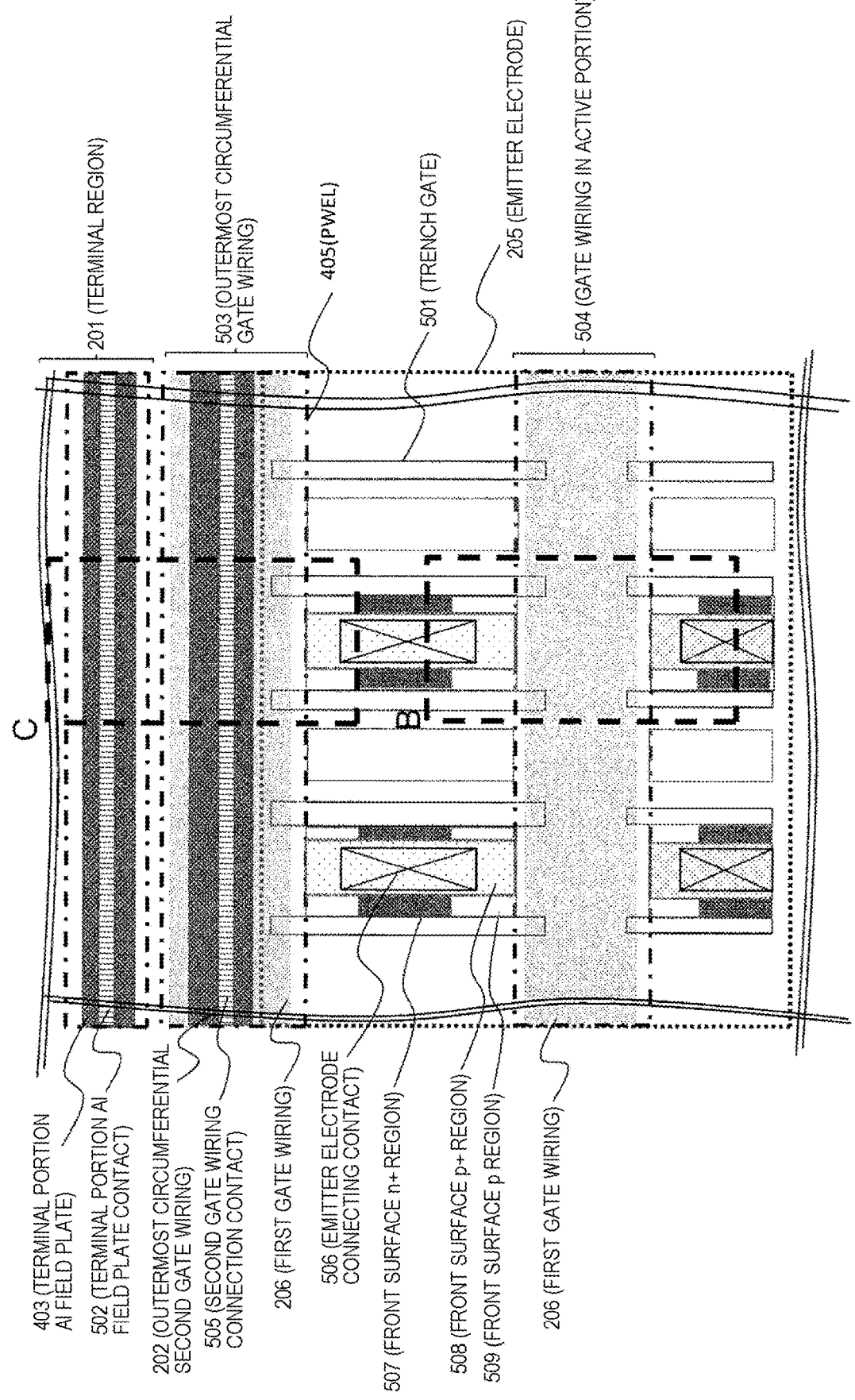
FIG. 5 is a layout diagram of a main part of the portion of the IGBT chip in the semiconductor device according to the first embodiment of the present invention.
Figure 6:
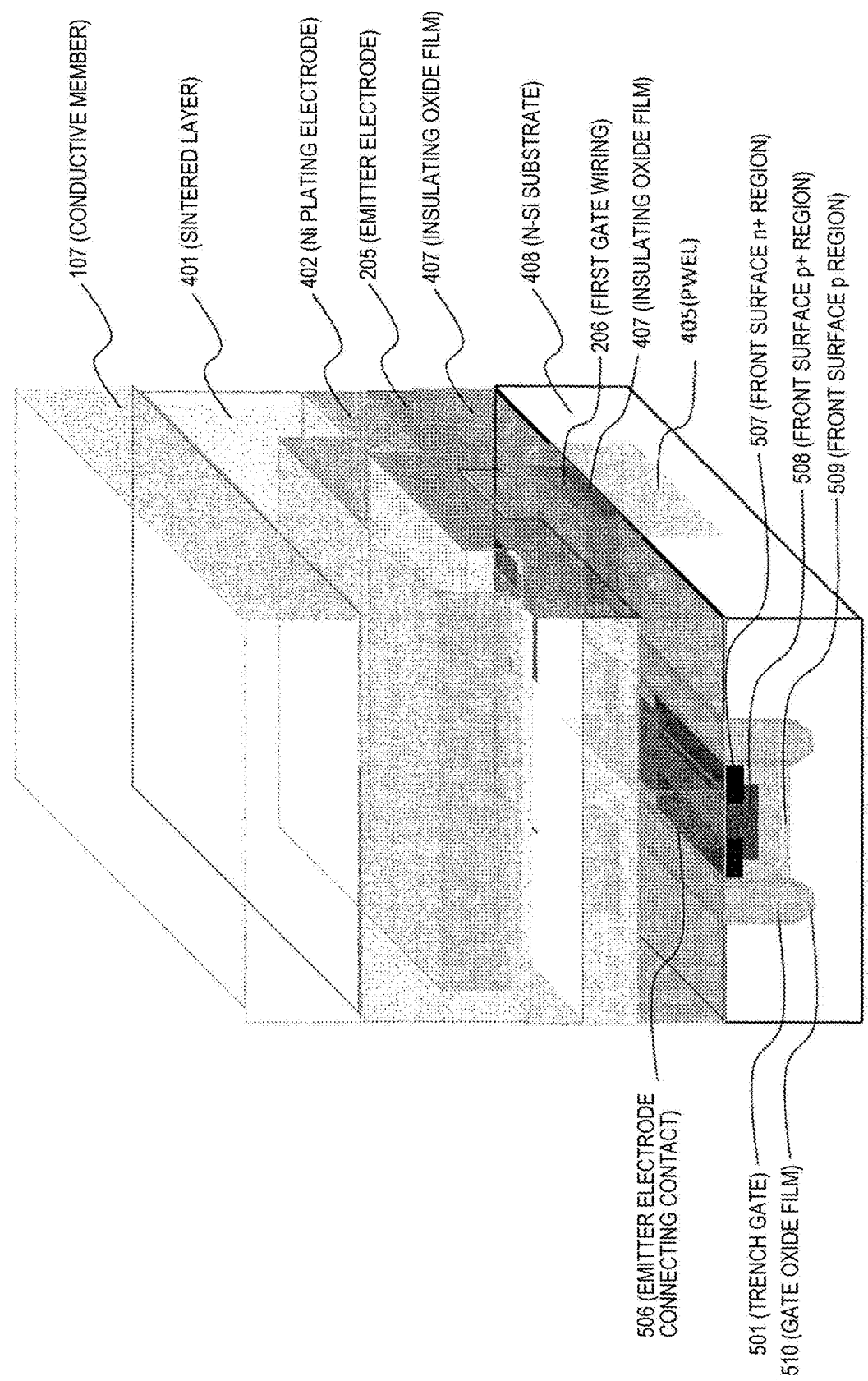
Figure 7:
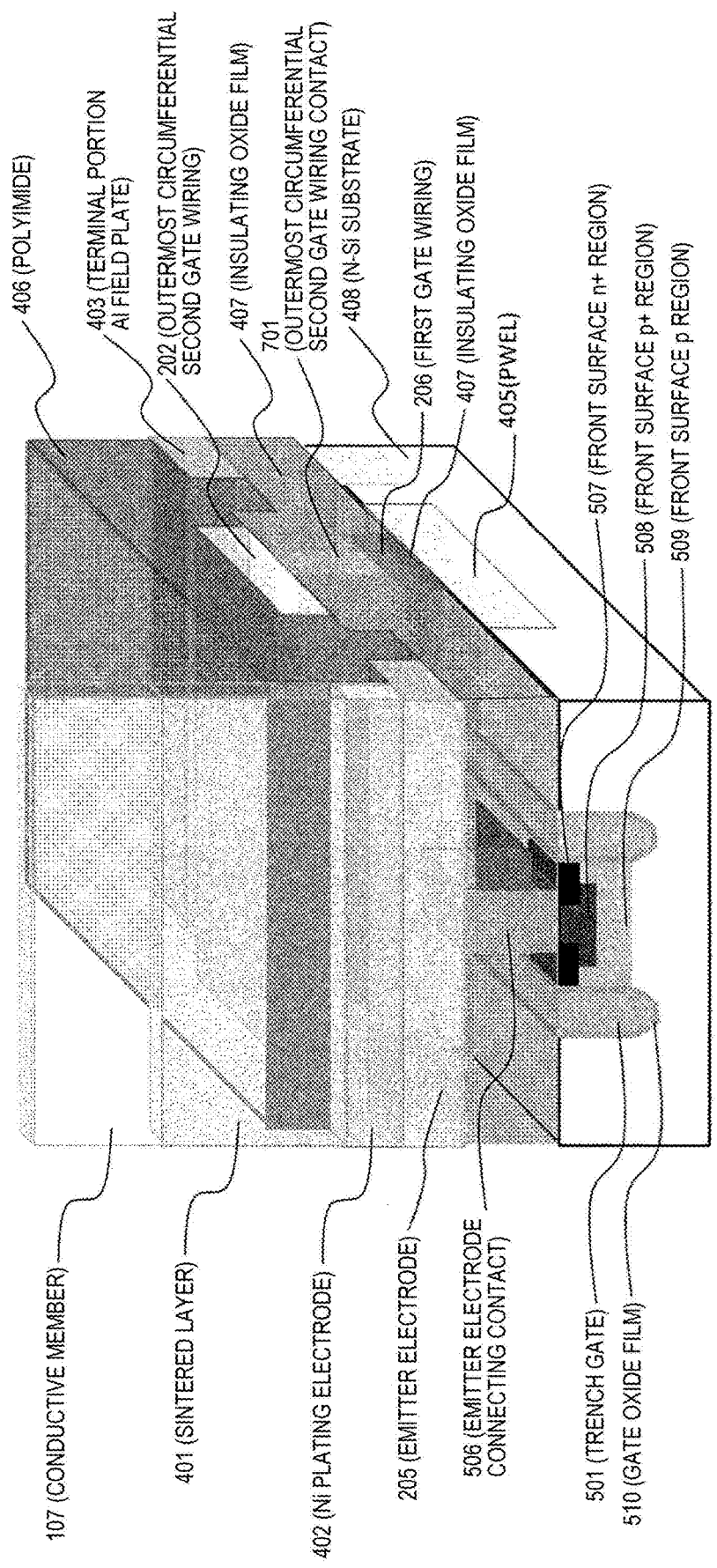
FIG. 7 is a bird's-eye view of a region C of FIG. 5 of the semiconductor device according to the first embodiment of the present invention.
Figure 8:
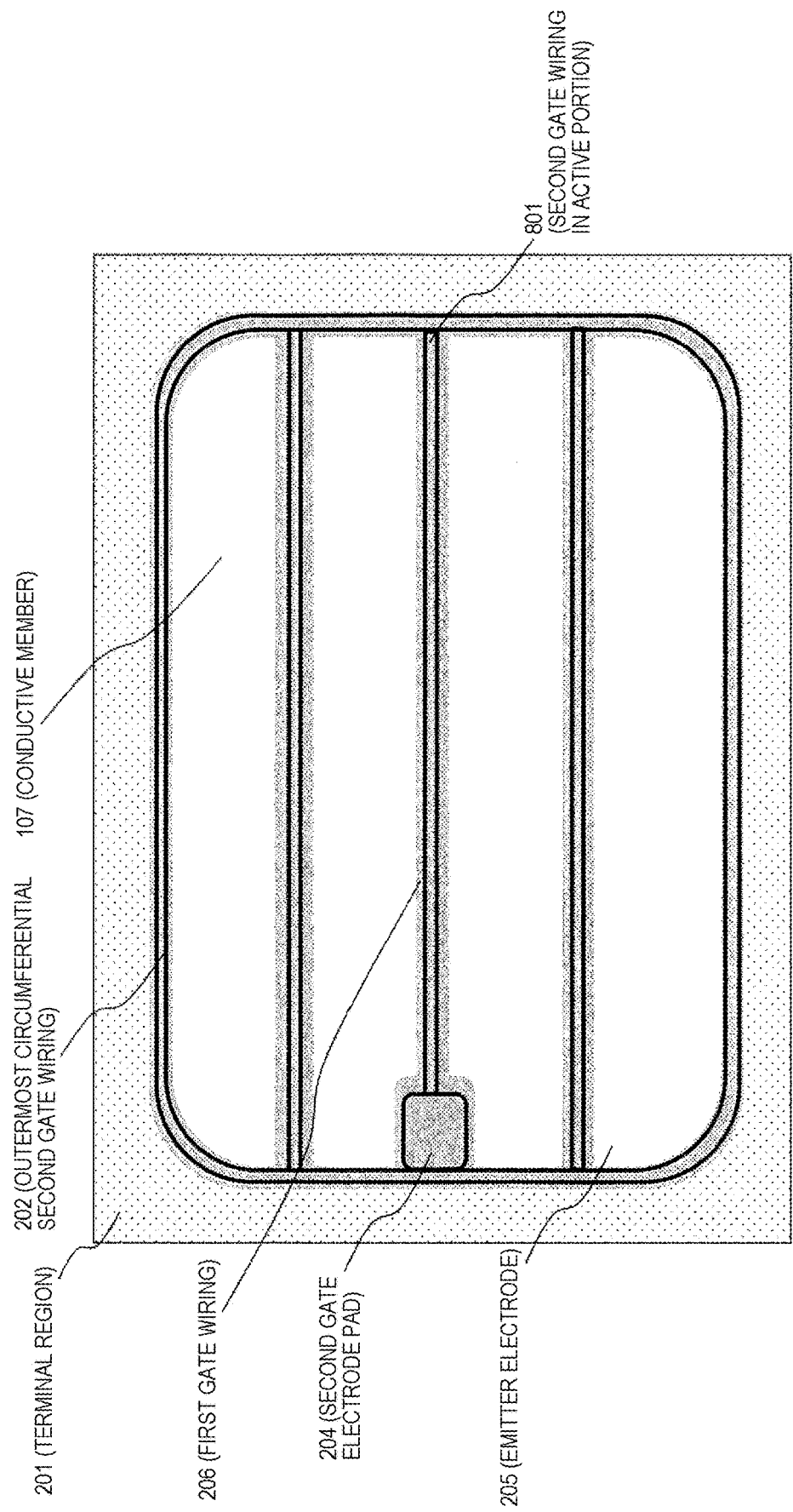
FIG. 8 is a top view of a portion of an IGBT chip in a semiconductor device of the related art.

FIG. 5 is a layout diagram of a main part of the front surface of the portion of the IGBT chip of the semiconductor device. Although the semiconductor device of this example is a semiconductor device having a so-called trench gate type IGBT chip in which a gate is formed as a trench gate 501 which is a type of a side gate structure, the present invention is not limited to the trench gate type. That is, the configuration including the trench gate type IGBT chip is merely an example, and a semiconductor device including a semiconductor chip having another gate structure is also included in the technical scope of the present invention. Further, FIGS. 6 and 7 illustrate bird's-eye views of a region B and a region C in FIG. 5, respectively. The gate wirings are roughly divided into a gate wiring 504 in the active portion and an outermost circumferential gate wiring 503.

The trench gate 501 is arranged between the respective gate wirings so as to be orthogonal to the gate wirings, and a front surface n+ layer 507, a front surface p+ layer 508, and a front surface p layer 509 are formed between the trench gates. The front surface n+ layer 507 is a source of electrons when a gate voltage is applied, and the front surface p layer 509 serves a role of determining a threshold voltage when the gate voltage is applied. The front surface p+ layer 508 gives a potential to the front surface p layer 509 and becomes a hole current path during the operation of the IGBT. The front surface p+ layer 508 and the front surface n+ layer 507 are connected to the emitter electrode 205 via an emitter electrode connecting contact 506. The Ni plating electrode 402 is formed on the emitter electrode and is connected to the conductive member 107 by the sintered layer 401. Here, at least the emitter electrode 205 and the sintered layer 401 are formed on the first gate wiring 206 in the active portion in which the conductive member 107 is arranged so as to cover the first gate wiring 206, and the conductive member 107 is arranged on the emitter electrode 205 and the sintered layer 401. In particular, the configuration in which the Ni plating electrode 402 is formed on the emitter electrode 205 and the sintered layer 401 is formed on the Ni plating electrode 402, that is, the configuration in which a multilayer structure (that is, a layer structure having two or more layers) including at least the emitter electrode 205 and the sintered layer 401 has the electrode layer (for example, the Ni plating electrode 402) containing Ni as a component between the emitter electrode 205 and the sintered layer 401 is adopted in this example, but the present invention is not limited to such a configuration, and the Ni plating electrode 402 is not an indispensable component. Further, the above-described multilayer structure is arranged to be continuously present over a wide range including not only an emitter lead-out region (a region where the emitter electrode connecting contact 506 is present) but also the emitter electrode connecting contact 506 and the gate wiring region (a region where the gate wiring 504 in the active portion is present and a region where a part of the outermost circumferential gate wiring 503 is present). That is, the semiconductor device of this example is the semiconductor device including: the semiconductor chip 105; the first gate wiring 206 and the second gate wiring 202 formed on the front surface of the semiconductor chip 105; the emitter electrode 205 arranged so as to cover the first gate wiring 206; and the sintered layer 401 arranged above the emitter electrode 205. In the semiconductor device, the multilayer structure formed of at least the emitter electrode 205 and the sintered layer 401 is continuously present over the range including the emitter electrode connecting contact 506 and the gate wiring regions 503 and 504 on the front surface of the semiconductor chip 105. This multilayer structure serves a role of mainly protecting the gate wiring region from the pressure during sintering and joining and also serves a role of protecting the inside of the Si substrate.

Although the first gate wiring 206 can be configured as, for example, a buried trench-type gate wiring, the present invention is not limited to such a configuration, and may be configured such that a gate wiring of another type, such as a non-buried type as illustrated in FIG. 6, is formed. Further, the first gate wiring 206 and the second gate wiring 202 are connected by an outermost circumferential second gate wiring contact 701 in an outermost circumferential gate wiring region.

Figure 9:
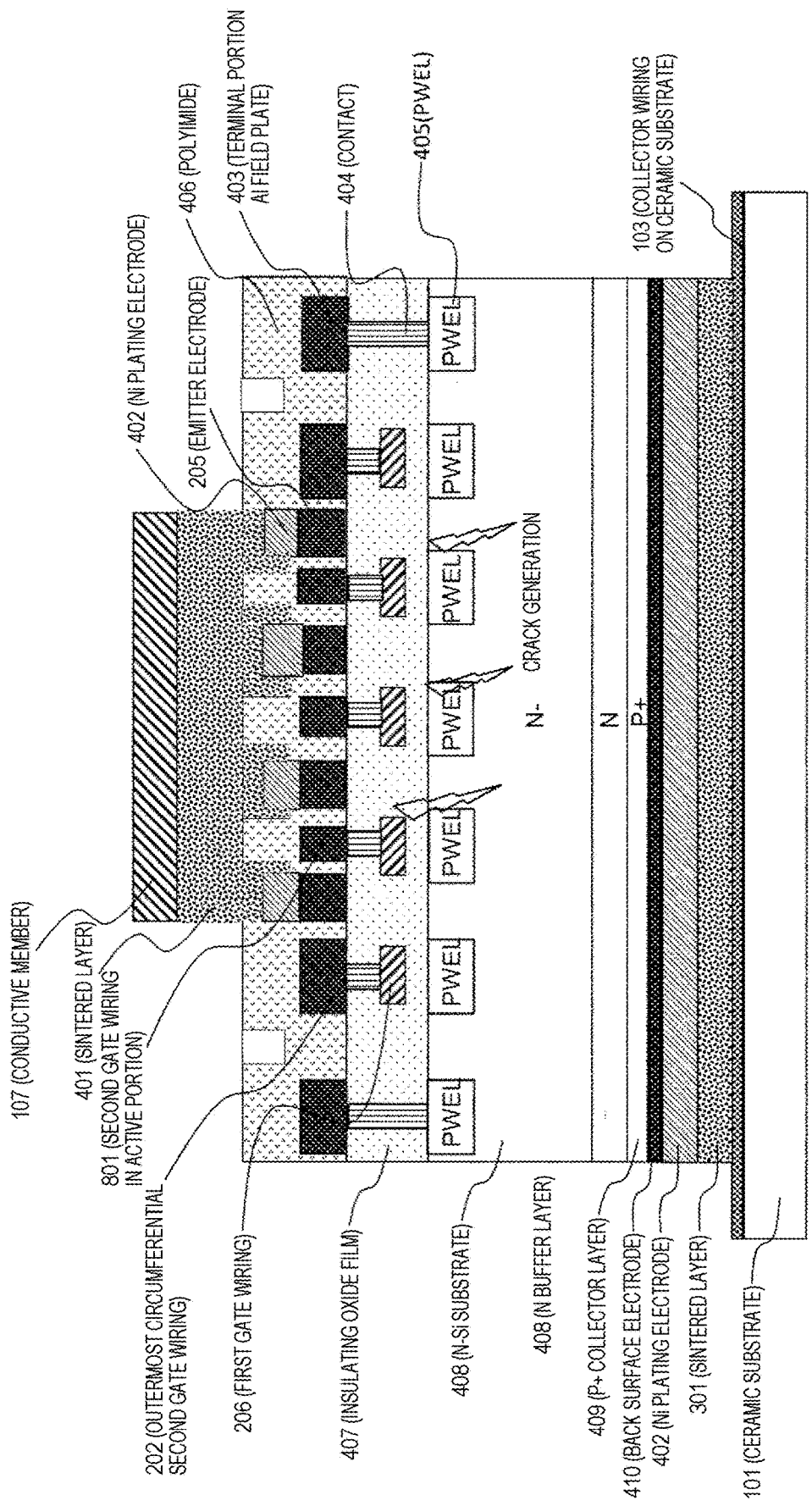
FIG. 9 is a cross-sectional view of the portion of the IGBT chip in the semiconductor device of the related art.
Figure 10:
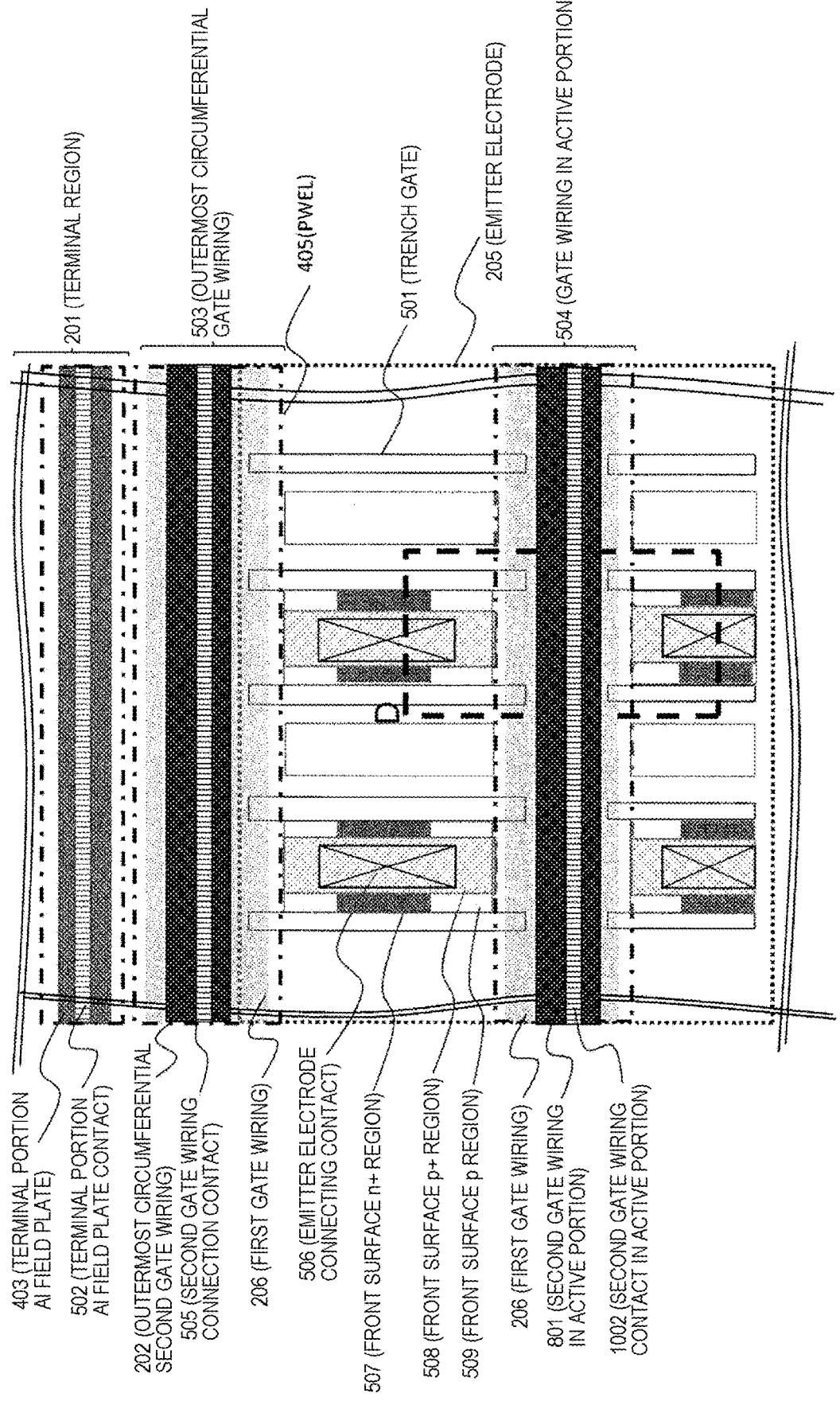
FIG. 10 is a layout diagram of a main part of the portion of the IGBT chip in the semiconductor device of the related art.
Figure 11:
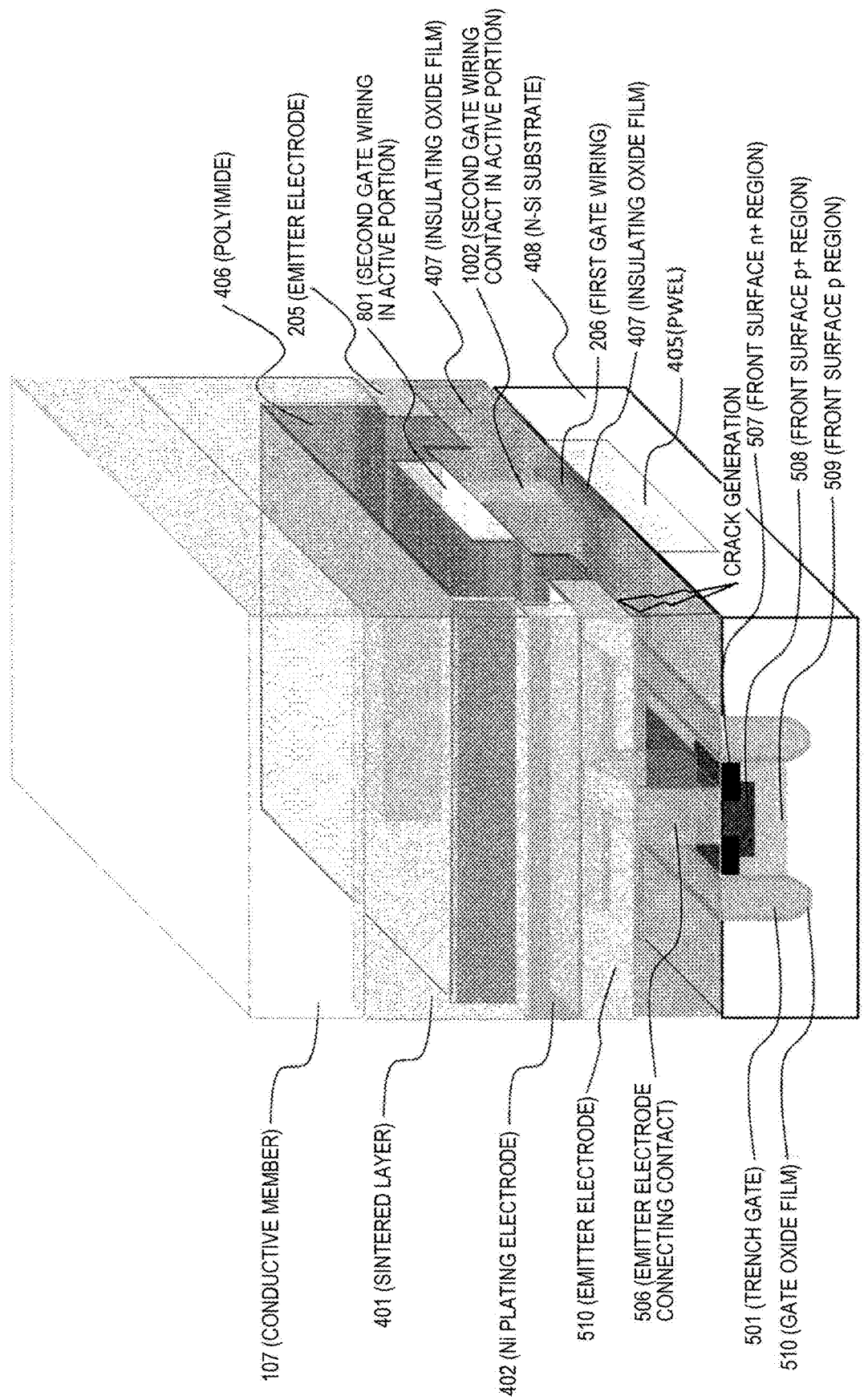
FIG. 11 is a bird's-eye view of a region D of FIG. 10 of the semiconductor device of the related art.

The polyimide 406 configured for insulation from the emitter electrode and the terminating Al field plate is formed on the second gate wiring. It is preferable that the gate wiring distribute the signal input from the gate electrode pad into the IGBT chip and uniformly distribute a gate signal. The gate signal generates a delay according to a CR time constant determined depending on a gate wiring resistance and a gate capacitance. The gate wiring is preferably arranged so as to reduce a resistance due to silicidation or reduce a difference in CR time constant due to intra-chip split wiring. FIGS. 9, 10, and 11 illustrate a cross-sectional structure, a layout of a main part of an IGBT chip surface, and a bird's eye view of the related art, respectively. When a second gate wiring 801 is provided on the first gate wiring 206 in the active portion via a second gate wiring contact 1002 in the active portion, a difference in level between the second gate wiring in the active portion and the emitter electrode 205 is large, and pressure is not uniformly applied due to the pressure when connecting the conductive member 107 and the IGBT chip so that a crack is generated in the second gate wiring 801 and the inside of Si, and a short-circuit defect is generated between the gate and the emitter which is the main electrode. With the structure of the present invention, it is possible to reduce the difference in level between the second gate wiring in the active portion and the emitter electrode 205 so that the pressure is uniformly applied, and it is possible to reduce the crack generation with mechanical protection of the gate wiring by the emitter electrode and Ni plating.

Example 2

Figure 12:
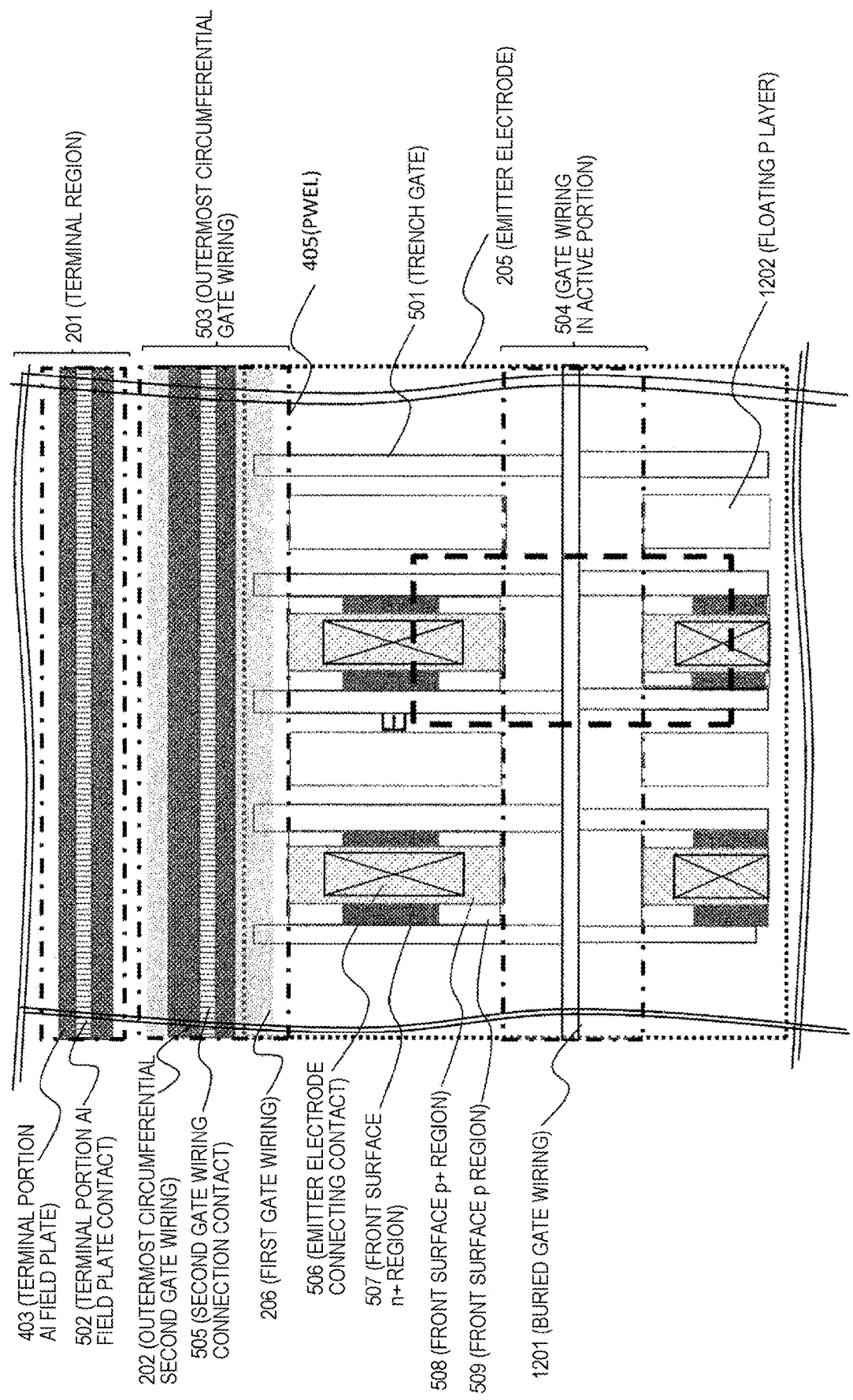
FIG. 12 is a layout diagram of a main part of a portion of an IGBT chip in a semiconductor device according to a second embodiment of the present invention.
Figure 13:
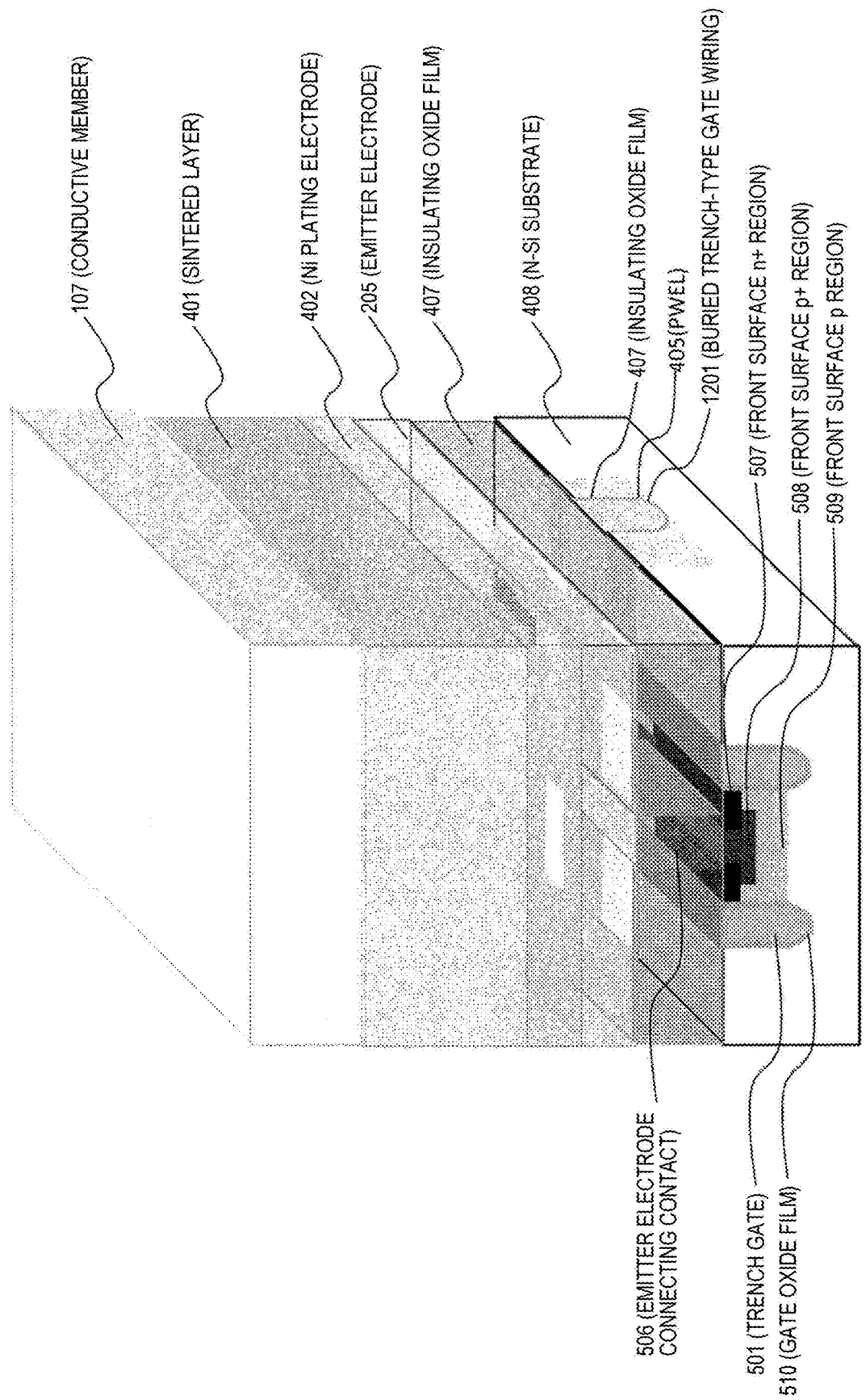
FIG. 13 is a bird's-eye view of a region E of FIG. 12 according to the second embodiment of the present invention.

FIG. 12 is a layout diagram of a main part of a portion of the IGBT chip in a semiconductor device according to Example 2 which is a second embodiment of the present invention. Further, FIG. 13 is a bird's-eye view of a region E of FIG. 12. Parts having the same configurations as those of Example 1 will be denoted by the same reference numerals, and the overlapping part will not be described.

A feature of this example is that the active portion gate wiring 504 is buried in a trench portion to form a buried gate wiring 1201, which is different from Example 1. The other matters are common to those of Example 1. The buried gate wiring 1201 is formed in the same step as the trench gate 501, and the trench gate 501 and the buried gate wiring 1201 are connected in the trench. As compared with Example 1, it is possible to further reduce a difference in level between the active portion gate wiring 504 and the emitter electrode 205. Pressure at the time of connecting the conductive member 107 and an IGBT chip by a sintered layer is more uniformly applied, and it is possible to reduce generation of cracks with mechanical protection of the gate wiring by an emitter electrode and Ni plating.

Example 3

Figure 14:
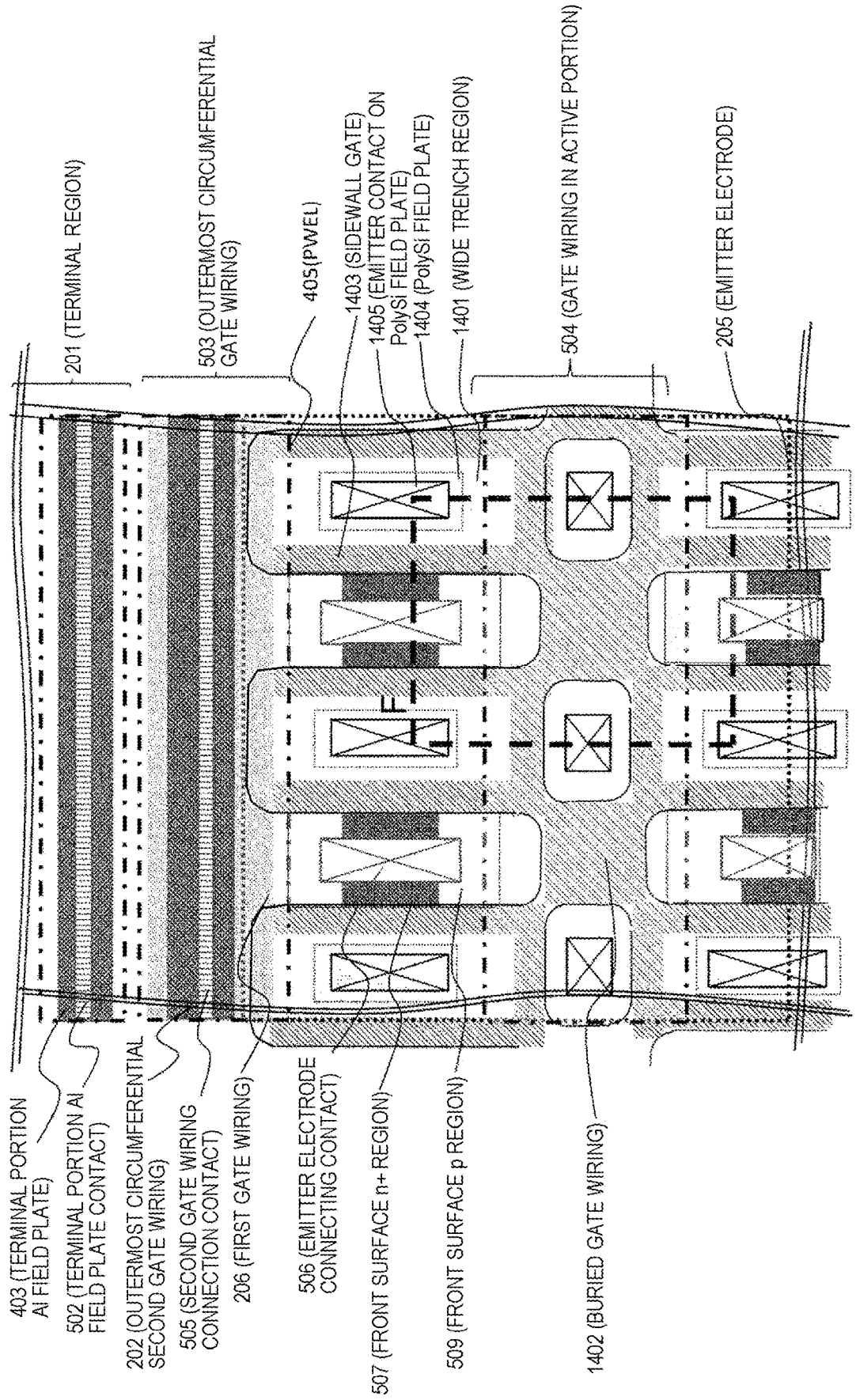
FIG. 14 is a layout diagram of a main part of a portion of an IGBT chip in a semiconductor device according to a third embodiment of the present invention.
Figure 15:
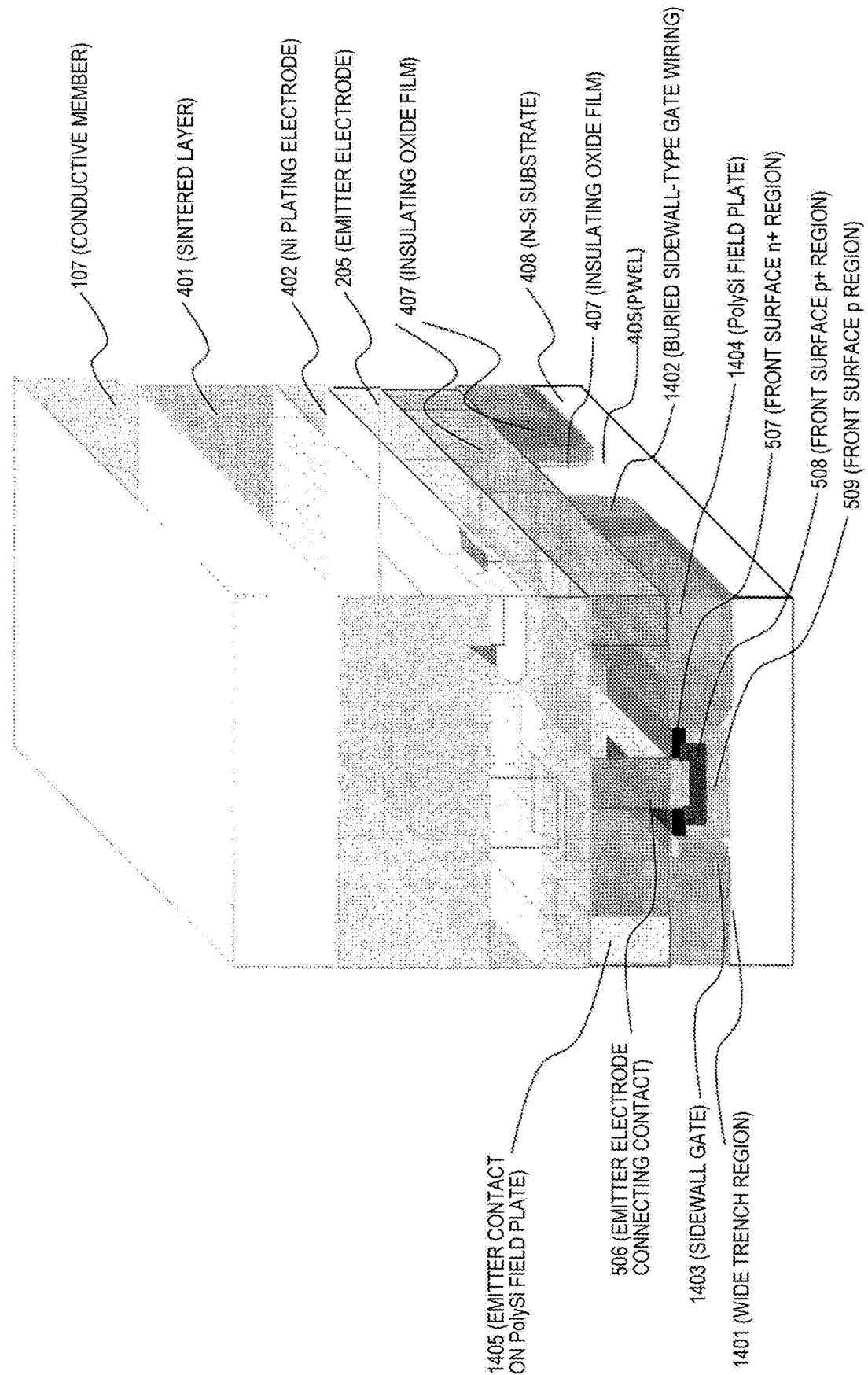
FIG. 15 is a bird's-eye view of a region F of FIG. 14 according to the third embodiment of the present invention.

FIG. 14 is a layout diagram of a main part of a portion of the IGBT chip in a semiconductor device according to Example 3 which is a third embodiment of the present invention. Further, FIG. 15 is a bird's-eye view of a region F of FIG. 14. Parts having the same configurations as those of Examples 1 and 2 will be denoted by the same reference numerals, and the overlapping part will not be described.

In the semiconductor device of this example, a gate is formed as a sidewall gate 1403 which is a type of a side gate structure, and the gate wiring 504 in the active portion is formed as a buried sidewall-type gate wiring 1402 and is connected to the sidewall gate 1403. This example is characterized by this point, and is different from Examples 1 and 2 in terms of this point. The other matters are common to those of Example 1.

A floating p layer 1202 is removed by providing a wide trench 1401. As a result, potential fluctuations of a gate due to influence of the floating p layer is eliminated, and the controllability of dv/dt is improved. Further, one side of the trench gate 501 is covered with a thick insulating film due to a structure of the sidewall gate 1403. As a result, feedback capacitance is reduced so that the controllability of dv/dt is improved. A Poly-Si field plate 1404 connected to the emitter electrode 205 is provided between the sidewall gates 1403 provided in the wide trench 1401. Since an electric field at a corner portion of the sidewall gate 1403 is mitigated by the Poly-Si field plate 1404, a breakdown voltage is secured. Further, a step generated by providing the wide trench 1401 is mitigated the Poly-Si field plate 1404. With the buried sidewall-type gate wiring 1402, it is possible to reduce a difference in level between the gate wiring 504 in the active portion and the emitter electrode 205, the pressure at the time of connecting the conductive member 107 and the IGBT chip by the sintered layer is more uniformly applied, and it is possible to reduce the crack generation with mechanical protection of the gate wiring by the emitter electrode and Ni plating, which is similar to Example 2.

Example 4

Example 4, which is an example of an embodiment in which the semiconductor device of the present invention is applied to a power conversion apparatus, will be described hereinafter.

Figure 16:
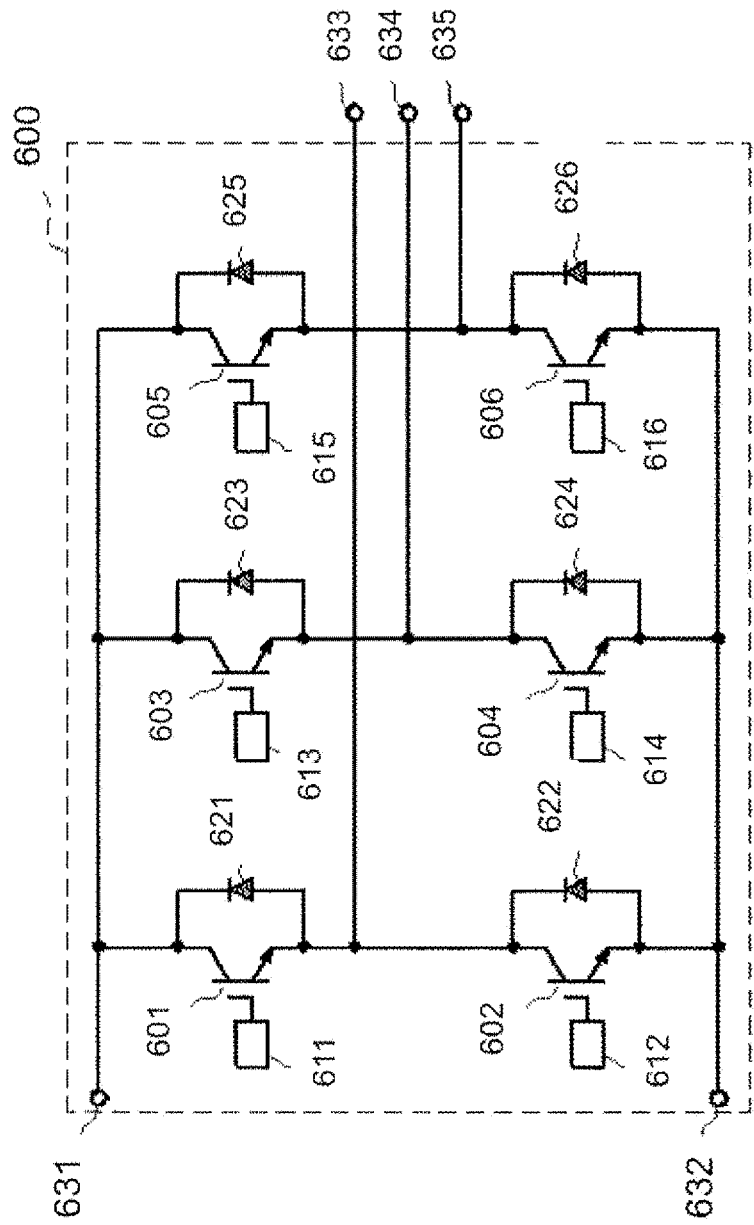
FIG. 16 is a circuit block diagram of a power conversion apparatus according to a fourth embodiment of the present invention.

FIG. 16 is a circuit block diagram illustrating a power conversion apparatus 600 adopting the semiconductor device according to Example 1 of the present invention as a constituent element. FIG. 16 illustrates a circuit configuration of the power conversion apparatus 600 according to this example and a connection relationship between a DC power supply and a three-phase AC motor (AC load), as an example of the power conversion apparatus of the present invention.

In the power conversion apparatus 600 of the present example, the semiconductor device of the first embodiment is used as power switching elements 601 to 606. The power switching elements 601 to 606 are, for example, IGBTs.

As illustrated in FIG. 16, the power conversion apparatus 600 of a fourth embodiment includes: a P terminal 631 and an N terminal 632 which are a pair of DC terminals; and a U terminal 633, a V terminal 634, and a W terminal 635 which are AC terminals as many as the number of phases of an AC output.

Further, the pair of power switching elements 601 and 602 are connected in series, and includes a switching leg having the U terminal 633, connected to such a series connection point, as an output. Further, the power switching elements 603 and 604 having the same configurations are connected in series, and includes a switching leg having the V terminal 634 connected to such a series connection point as an output. Further, the power switching elements 605 and 606 having the same configurations are connected in series, and includes a switching leg having the W terminal 635 connected to such a series connection point as an output.

The power switching elements 601 to 606 are, for example, IGBTs.

The three-phase switching legs consisting of the power switching elements 601 to 606 are connected between the DC terminals of the P terminal 631 and the N terminal 632 and to which DC power is supplied from a DC power supply (not illustrated). The U terminal 633, the V terminal 634, and the W terminal 635, which are three-phase AC terminals of the power conversion apparatus 600, are connected, as a three-phase AC power supply, to a three-phase AC motor (not illustrated).

Diodes 621 to 626 are connected in reverse parallel to the power switching elements 601 to 606, respectively. Gate circuits 611 to 616 are connected to input terminals of gates of the power switching elements 601 to 606, consisting of IGBTs, respectively, and the power switching elements 601 to 606 are controlled by the gate circuits 611 to 616, respectively.

That is, the power conversion apparatus of this example is a power conversion apparatus which receives DC power from an outside as an input, converts the input DC power into AC power, outputs the AC power, and includes: the pair of DC terminals (631 and 632) configured to receive the DC power as the input; and the AC terminals (633, 634, and 635) configured to output the AC power, the AC terminals as many as the number of AC phases related to the AC power. For each of the AC terminals (633, 634, and 635) provided as many as the number of phases, the power conversion apparatus is further configured such that a series circuit (for example, a series circuit of a parallel circuit of 601 and 621 and a parallel circuit of 602 and 622) having the configuration in which the two parallel circuits (for example, the parallel circuit of 601 and 621) each of which is obtained by connecting the switching element (for example, 601) and the diode (for example, 621) having a polarity opposite to a polarity of the switching element to each other in parallel are connected in series is connected between one (P terminal) of the pair of DC terminals (631 and 632) and the other (N terminal), and an interconnection point of the two parallel circuits forming the series circuit is connected to the AC terminal (for example, the U terminal 633) of a phase (for example, a U phase) corresponding to the series circuit. Further, the parallel circuit in such a configuration is configured using the semiconductor device of the present invention (for example, the semiconductor device according to any of Examples 1 to 3).

As described above, the semiconductor device of Example 1 has been described as the module in which the IGBT chip and the freewheel diode chip are mounted on the collector wiring on the common ceramic substrate, but the present invention is not limited to such a configuration. For example, a configuration in which a MOSFET chip is mounted together with a freewheel diode chip, or a diode-less configuration in which the MOSFET chip is mounted and a body diode of the MOSFET chip is used as a reflux diode without mounting the freewheel diode chip is also included in the technical scope of the present invention. Although it is apparent from the above description, it is a matter of course that the same configuration may be also applied regarding the relationship among the switching elements 601, 602, 603, 604, 605, and 606 and the diodes 621, 622, 623, 624, 625, and 626 in FIG. 16. That is, in the semiconductor device configured as the module in which the IGBT chip and the freewheel diode chip are mounted on the collector wiring on the common ceramic substrate, which has been described in Example 1, the switching elements 601, 602, 603, 604, 605, and 606 are configured using the semiconductor chip (for example, the IGBT chip 105), and the diodes 621, 622, 623, 624, 625, and 626 are configured using the diode chip 106 which is joined to the collector wiring 103 on the common ceramic substrate 101 together with the semiconductor chip 105 by the lower sintered layer 401 which is separated from the upper sintered layer 401, but the power conversion apparatus of the present invention is not limited to such a configuration.

Incidentally, the gate circuits 611 to 616 are preferably configured to be collectively controlled by an integrated control circuit (not illustrated).

The gate circuits 611 to 616 collectively and appropriately control the power switching elements 601 to 606, respectively, so that DC power of a DC power supply Vcc is converted into three-phase AC power and output from the U terminal 633, the V terminal 634, and the W terminal 635.

As the semiconductor device according to each of the embodiments is applied to the power conversion apparatus 600, the long-term reliability of the power conversion apparatus 600 is improved. Further, the power conversion apparatus 600 is free of lead since solder is not used, and thus, has an effect favorable for the environment. Further, the power conversion apparatus 600 can be installed in a place under a high-temperature environment, and it is possible to secure the long-term reliability without having a dedicated cooler.

As described above, according to the above-described examples of the present invention, it is possible to provide the semiconductor device and the power conversion apparatus using the same in which excessive stress is hardly generated in the gate wiring portion of the semiconductor chip even if pressurization is performed in the sintering and joining process when the metal plate (conductive member) is sintered and joined onto the semiconductor chip having the gate structure such as the IGBT and characteristic defects such as the short-circuit defect between the gate and the emitter as the main electrode and a defect of a decrease in main breakdown voltage between the emitter and the collector are reduced.

Accordingly, the present invention relates to a junction layer of an electrical junction (for example, a junction between a semiconductor element and a circuit member) in an electronic component, and particularly, is suitable for the application to a semiconductor device having a junction layer joined by using a joining material mainly containing copper oxide particles.

Incidentally, the case of the inverter device has been described as the example in which the semiconductor device of the present invention is applied to the power conversion apparatus in the present embodiment. However, the present invention is not limited thereto, and can be also applied to other power conversion apparatuses such as a DC-DC converter and an AC-DC converter.

REFERENCE SIGNS LIST

101 ceramic substrate
102 gate wiring on ceramic substrate
103 collector wiring on ceramic substrate
104 emitter wiring on ceramic substrate
105 IGBT chip
106 diode chip
107 conductive member
108 bonding wire
109 emitter sense wiring on ceramic substrate
201 terminal region
202 second gate wiring
204 second gate electrode pad
205 emitter electrode
206 first gate wiring
401 sintered layer
402 Ni plating electrode
403 terminal portion Al field plate
404 contact
405 PWEL
406 polyimide
407 insulating oxide film
408 N− Si substrate
409 P+ collector layer
410 back surface collector electrode
411 N buffer layer
501 trench gate
502 terminal portion Al field plate contact
503 outermost circumferential gate wiring
504 gate wiring in active portion
505 second gate wiring connection contact
506 emitter electrode connecting contact
507 front surface n+ region
508 front surface p+ region
509 front surface p region
510 gate oxide film
701 outermost circumferential second gate wiring contact
801 second gate wiring in active portion
1002 second gate wiring contact in active portion
1201 buried gate wiring
1401 wide trench region
1402 buried gate wiring
1403 sidewall gate
1404 Poly-Si field plate
1405 emitter contact on Poly-Si field plate
600 power conversion apparatus
601 to 606 power switching element
621 to 626 diode
611 to 616 gate circuit

The invention claimed is:

1. A semiconductor device comprising:
a semiconductor chip;
a first gate wiring and a second gate wiring formed on a front surface of the semiconductor chip;
an emitter electrode arranged so as to cover the first gate wiring; and
a sintered layer arranged above the emitter electrode,
wherein a multilayer structure consisting of at least the emitter electrode and the sintered layer is continuously present over a range including an emitter electrode connecting contact and a gate wiring region on the front surface of the semiconductor chip.

2. The semiconductor device according to claim 1, wherein
the semiconductor chip is joined to a collector wiring on a common ceramic substrate together with a diode chip by another sintered layer separated from the sintered layer.

3. The semiconductor device according to claim 1, wherein
the multilayer structure is configured to include an electrode layer, which contains nickel (Ni) as a component, between the emitter electrode and the sintered layer.

4. The semiconductor device according to claim 3, wherein
the semiconductor chip is joined to a collector wiring on a common ceramic substrate together with a diode chip by another sintered layer separated from the sintered layer.

5. The semiconductor device according to claim 1, wherein
the semiconductor chip is configured to include a gate having a side gate structure.

6. The semiconductor device according to claim 5, wherein
the semiconductor chip is joined to a collector wiring on a common ceramic substrate together with a diode chip by another sintered layer separated from the sintered layer.

7. The semiconductor device according to claim 5, wherein
the side gate structure is a trench gate structure in which the gate is a trench gate.

8. The semiconductor device according to claim 7, wherein
the semiconductor chip is joined to a collector wiring on a common ceramic substrate together with a diode chip by another sintered layer separated from the sintered layer.

9. The semiconductor device according to claim 7, wherein
the first gate wiring is a trench-buried type gate wiring which is connected to the trench gate.

10. The semiconductor device according to claim 9, wherein
the semiconductor chip is joined to a collector wiring on a common ceramic substrate together with a diode chip by another sintered layer separated from the sintered layer.

11. The semiconductor device according to claim 5, wherein
the side gate structure is a sidewall gate structure in which the gate is a sidewall gate.

12. The semiconductor device according to claim 11, wherein
the semiconductor chip is joined to a collector wiring on a common ceramic substrate together with a diode chip by another sintered layer separated from the sintered layer.

13. The semiconductor device according to claim 11, wherein
the first gate wiring is a buried sidewall-type gate wiring which is connected to the sidewall gate.

14. The semiconductor device according to claim 13, wherein
the semiconductor chip is joined to a collector wiring on a common ceramic substrate together with a diode chip by another sintered layer separated from the sintered layer.

15. A power conversion apparatus, which receives DC power from an outside as an input, converts the input DC power into AC power, and outputs the AC power, the power conversion apparatus comprising:
a pair of DC terminals configured to receive the DC power as the input; and
AC terminals configured to output the AC power, the AC terminals as many as a number of AC phases related to the AC power,
for each of the AC terminals provided as many as the number of phases, the power conversion apparatus further being configured such that a series circuit having a configuration in which two parallel circuits each of which is obtained by connecting a switching element and a diode having a polarity opposite to a polarity of the switching element to each other in parallel are connected in series is connected between one of the pair of DC terminals and the other, and an interconnection point of the two parallel circuits forming the series circuit is connected to the AC terminal of a phase corresponding to the series circuit,
wherein the parallel circuit is configured using the semiconductor device according to claim 1.

16. The power conversion apparatus according to claim 15, wherein
the multilayer structure is configured to include an electrode layer, which contains nickel (Ni) as a component, between the emitter electrode and the sintered layer.

17. The power conversion apparatus according to claim 15, wherein
the semiconductor chip is configured to include a gate having a side gate structure.

18. The power conversion apparatus according to claim 15, wherein
the switching element is configured using the semiconductor chip, and
the diode is configured using a diode chip joined to a collector wiring on a common ceramic substrate together with the semiconductor chip by another sintered layer separated from the sintered layer.

19. The power conversion apparatus according to claim 18, wherein
the multilayer structure is configured to include an electrode layer, which contains nickel (Ni) as a component, between the emitter electrode and the sintered layer.

20. The power conversion apparatus according to claim 18, wherein
the semiconductor chip is configured to include a gate having a side gate structure.

* * * * *